(12) United States Patent
Kohler et al.

(10) Patent No.: US 7,746,692 B2
(45) Date of Patent: Jun. 29, 2010

(54) MULTIPLE-LEVEL MEMORY WITH ANALOG READ

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 209 days.

(21) Appl. No.: 12/023,092

(22) Filed: Jan. 31, 2008

(65) Prior Publication Data

US 2009/0196098 A1  Aug. 6, 2009

(51) Int. Cl.
*G11C 11/34* (2006.01)

(52) U.S. Cl. .............................. 365/185.03; 365/185.24

(58) Field of Classification Search ............ 365/185.03, 365/185.24
See application file for complete search history.

(56) References Cited

U.S. PATENT DOCUMENTS 5,896,332 A * 4/1999 Brauch ....................... 365/201
2004/0085794 A1 * 5/2004 Perner ......................... 365/51
2006/0083097 A1 * 4/2006 Frulio et al. ........... 365/230.03

* cited by examiner

*Primary Examiner*—Michael T Tran
(74) *Attorney, Agent, or Firm*—Ryan, Mason & Lewis, LLP

(57) ABSTRACT

A memory circuit includes a plurality of memory cells, each of the memory cells being operative to store multiple bits of data therein, and a plurality of column lines and row lines coupled to the memory cells for selectively accessing the memory cells. The circuit further includes multiple sense amplifiers, each of the sense amplifiers being connected to a corresponding one of the column lines and being operative to detect an electric charge stored in a selected one of the memory cells coupled to the corresponding column line and to generate an analog signal indicative of the stored electric charge. An analog multiplexer is connected to the sense amplifiers. The analog multiplexer is operative to receive the respective analog signals from the sense amplifiers and to generate an analog output signal having a magnitude which varies in time as a function of the respective analog signals from the sense amplifiers.

20 Claims, 3 Drawing Sheets

MULTIPLE-LEVEL MEMORY WITH ANALOG READ

FIELD OF THE INVENTION

The present invention relates generally to the electrical, electronic, and computer arts, and more particularly relates to semiconductor memory devices.

BACKGROUND OF THE INVENTION

Nonvolatile memory, such as, for example, flash memory, is utilized in a wide variety of electronic devices and applications. In order to increase information storage density, flash memory has evolved from single-level-cell (SLC) memory, wherein each of the memory cells contain a single binary bit of information (e.g., two levels of charge store) to multiple-level-cell (MLC) memory, wherein each of the memory cells contain a plurality of bits of information. The present state of the art is MLC memory wherein each cell is capable of storing two bits of information represented in one of four discrete charge levels within the cell.

Unfortunately, however, to discriminate between multiple discrete charge levels stored within multi-level flash memory cells, sense amplifiers used in the memory for reading the respective states of the cells therein, are either many times larger than for single-level flash memory, or take significantly longer time to discriminate the multiple charge levels. Sense amplifiers are typically placed on column pitch within a given memory, so there are many sense amplifiers within the memory. Each column or small group of multiplexed columns in the memory typically has its own sense amplifier(s). The problem of discriminating between multiple discrete charge levels stored within the cells becomes particularly acute as the number of bits stored within a single memory cell increases.

Because multi-level flash memory has, thus far, been limited to two bits per memory cell, this discrimination problem has been relatively manageable with only limited impact on the size and/or performance of the memory. Conventional approaches for determining the stored state of a two-bit flash memory cell involve employing multiple (e.g., three) sense amplifiers to discriminate between the four discrete charge levels indicative of the four states of the cell. Alternatively, single sense amplifiers have been used to iteratively discriminate between the four charge levels. In this instance, a three-loop iteration is required.

Another problem in high-density flash memory is that as the number of bits stored within a single memory cell increases, the measurable difference between respective charge levels decreases, thereby increasing the likelihood of an error in reading the state of the memory cell. For example, while a two-bit cell must store four discrete charge levels, a four-bit cell must store 16 discrete charge levels. The difference between successive charge levels for a four-bit memory cell will be significantly smaller compared to a two-bit memory cell. Consequently, more sophisticated error correction schemes are required to detect and correct erroneous bits of stored data using conventional methodologies.

Accordingly, there exists a need for techniques for increasing data storage density in a flash memory device which do not suffer from one or more of the above-described problems associated with conventional memory devices.

SUMMARY OF THE INVENTION

Illustrative embodiments of the present invention meet the above-noted need by providing techniques for increasing the number of charge levels stored within a memory cell of a memory circuit without significantly increasing a size or degrading performance of the circuit. To accomplish this, a memory circuit in accordance with aspects of the invention is configured to convert the charge stored in a plurality of selected MLC memory cells to an analog output signal having a magnitude which varies in time. The analog output signal generated by the memory circuit may be comparable, for example, to the signal picked up off a hard disk drive surface when read by a hard disk drive head.

In accordance with one aspect of the invention, a memory circuit includes a plurality of memory cells, each of the memory cells being operative to store multiple bits of data therein, and a plurality of column lines and row lines coupled to the memory cells for selectively accessing the memory cells. The circuit further includes multiple sense amplifiers, each of the sense amplifiers being connected to a corresponding one of the column lines and being operative to detect an electric charge stored in a selected one of the memory cells coupled to the corresponding column line and to generate an analog signal indicative of the stored electric charge. An analog multiplexer is connected to the sense amplifiers. The analog multiplexer is operative to receive the respective analog signals from the sense amplifiers and to generate an analog output signal having a magnitude which varies in time as a function of the respective analog signals from the sense amplifiers.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary flash memory circuits. It is to be understood, however, that the techniques of the present invention are not limited to the circuits shown and described herein. Rather, embodiments of the invention are directed to techniques for advantageously increasing the number of data bits that can be reliably stored in a memory cell of a memory circuit utilizing multiple-level memory cells, without significantly impacting performance and/or area of the circuit. Although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

A "device" as the term is used herein is intended to be broadly construed so as to encompass, by way of example only and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements having embedded memory. A "memory" as the term is used herein is intended to be broadly construed so as to encompass any element that can be employed to at least temporarily store information (e.g., data), typically as binary data although not limited thereto, primarily nonvolatile memory (e.g., flash memory).

High density flash memory, such as, for example, universal serial bus (USB) port mass storage flash devices, secure digital (SD) cards, Extreme Digital (XD) cards and compact flash (CF) cards, generally use advanced error correction data processing. Such error correction may include, for example, Bose-Chaudhuri-Hocquenghem (BCH) and Reed-Soloman (RS) error correcting codes, to correct defective and/or erroneous bits within the flash memory. Although modern flash memory density is limited to about 8 gigabytes (GB), techniques of the present invention described herein beneficially seek to accelerate the extension of flash memory to even higher densities.

Figure 1:
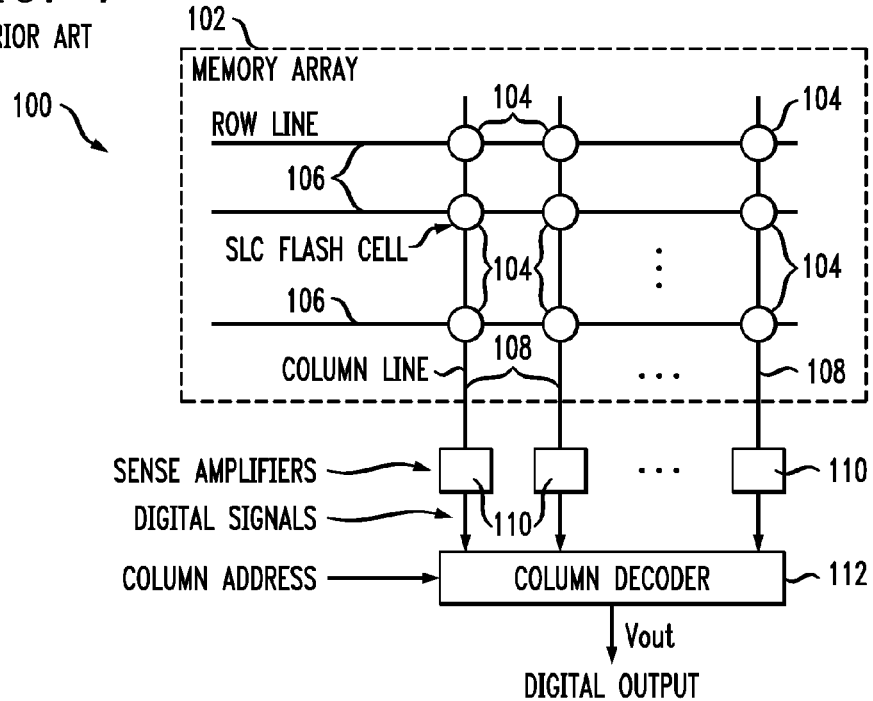
FIG. 1 is a block diagram depicting at least a portion of a conventional memory circuit employing SLC flash memory cells.

FIG. 1 is a block diagram depicting at least a portion of a conventional memory circuit 100. Memory circuit 100 comprises a memory array 102 including a plurality of SLC flash memory cells 104, a plurality of row lines 106, and a plurality of column lines 108. Preferably, there is a memory cell 104 coupled to each unique pair of column and row lines.

Every column line or group of column lines in memory circuit 100 is associated with its own dedicated sense amplifier 110, although alternative arrangements may be used. Each of the sense amplifiers 110 is adapted for reading the logic state of a selected one of the memory cells 104 connected to a corresponding column line 108 and for generating a digital output signal indicative of the logic state read from the selected memory cell. When read, the amount of charge stored in the memory cells 104 is detected by the sense amplifiers 110 and is outputted as a digital logic level, for example, a logic "0" or a logic "1" indicative of a low or high logic state, respectively. A column decoder 112 in the memory circuit 100 is operative to receive each of the digital output signals from the respective sense amplifiers 110 and to select one of the digital output signals as a digital output, Vout, of the memory circuit 100 as a function of a control signal, which may be a column address signal.

As previously stated, in order to increase storage density in a memory circuit, MLC memory cells may be employed. There are a number of techniques that can be used for detecting the data state of a MLC memory cell, although such techniques have, thus far, had a practical limit of two bits. For a MLC capable of storing two bits of data in one of four discrete charge levels, one technique involves the use of multiple sense amplifiers, each capable of discriminating between two of the four possible charge levels within the cell. More particularly, instead of having a single sense amplifier associated with each column, as with a SLC memory architecture, multiple sense amplifiers are utilized for each column in the memory circuit, as will be described in conjunction with FIG. 2.

Figure 2:
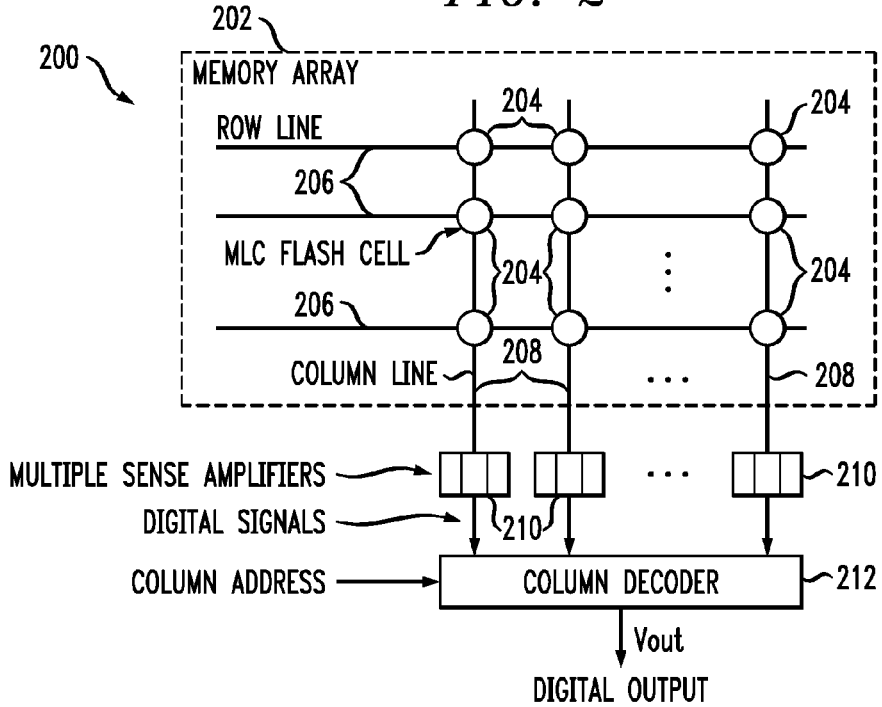
FIG. 2 is a block diagram depicting at least a portion of an exemplary memory circuit employing MLC flash memory cells which may be modified to implement techniques of the present invention.

With reference to FIG. 2, at least a portion of a memory circuit 200 is shown which may be modified to implement techniques of the present invention. Memory circuit 200 comprises a memory array 202 including a plurality of MLC flash memory cells 204, a plurality of row lines 206, and a plurality of column lines 208. Preferably, there is a memory cell 204 coupled to each unique pair of column and row lines.

Every column line or group of column lines in memory circuit 200 is associated with its own dedicated set of sense amplifiers 210. Each set of the sense amplifiers 210 preferably comprises three individual sense amplifiers which, in combination, are adapted for reading the logic state of a selected one of the memory cells 204 connected to a corresponding column line 208 and for generating a digital output signal indicative of the logic state read from the selected memory cell. When read, the amount of charge stored in the memory cells 204 is detected by each of the sense amplifiers in a given set of sense amplifiers 210. A single digital output signal is preferably generated by the set of sense amplifiers 210. The digital output of the three sense amplifiers is logically combined to generate the appropriate two-bit data code (00, 01, 10 or 11).

Table 1 below illustrates one example which uses a set of three sense amplifiers (e.g., numbered 1, 2 and 3) for detecting one of four charge levels (e.g., levels 1, 2, 3 and 4) indicative of the state of a selected MLC memory cell.

TABLE 1

| Sense Amplifier | Charge levels discriminated |
| --- | --- |
| 1 | Below level 2 |
| 2 | Below level 3 |
| 3 | Below level 4 |

In this example, the detected charge level falls into one of four categories: (i) below levels 2, 3 and 4; (ii) below only levels 3 and 4; (iii) below only level 4; and (iv) below none of these levels. This gives the four states. The respective digital outputs of the three sense amplifiers are logically combined to generate an appropriate 2-bit data code (e.g., 00, 01, 10, 11) indicative of the stored state of the selected MLC memory cell. A column decoder 212 in the memory circuit 200 is operative to receive each of the digital output signals (e.g., 2-bit data codes) from the respective sets of sense amplifiers 210 and to select one of the digital output signals as a digital output, Vout, of the memory circuit as a function of a control signal, which may be a column address signal.

Unfortunately, since each column line 208 in memory circuit 200 requires three or more sense amplifiers in order to generate an appropriate digital code which is representative of the stored state of a corresponding memory cell, the memory circuit will significantly increase in size, which is undesirable.

Figure 3:
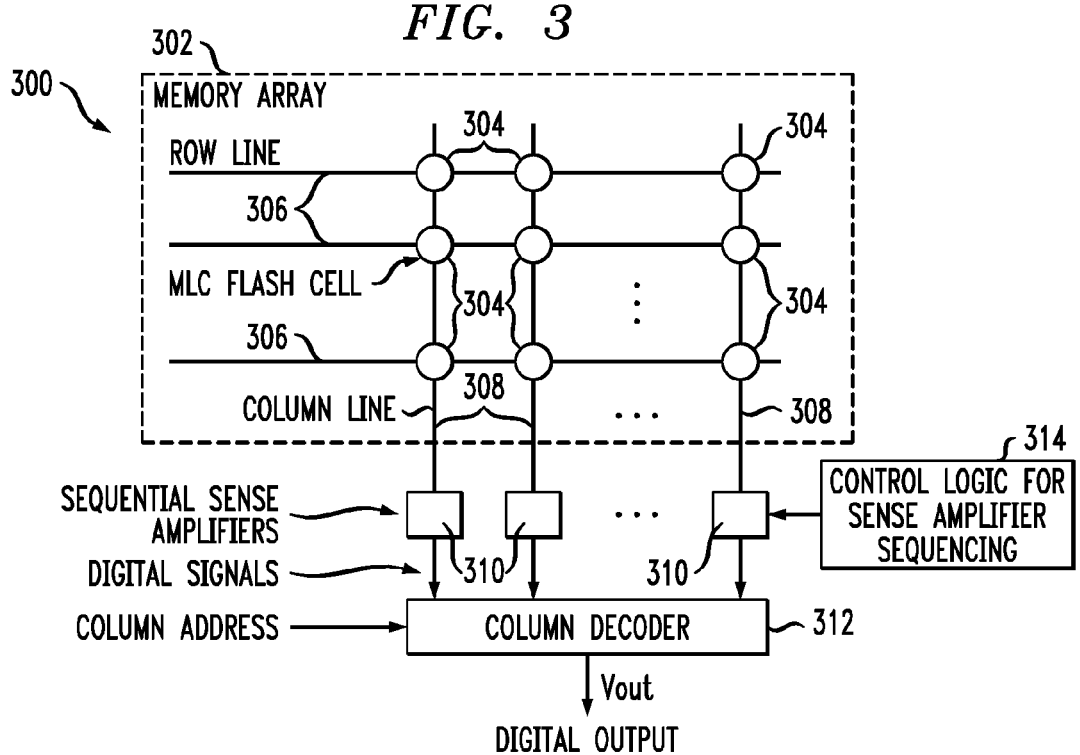
FIG. 3 is a block diagram depicting at least a portion of an exemplary memory circuit employing MLC flash memory cells which may be modified to implement techniques of the present invention.

FIG. 3 is a block diagram depicting at least a portion of an exemplary memory circuit 300 which employs an alternative methodology for determining the states of selected MLC memory cells. Specifically, memory circuit 300 comprises a memory array 302 including a plurality of MLC memory cells 304 and a plurality of row lines 306 and column lines 308 coupled to the memory cells for selectively accessing the cells. Preferably, there is a memory cell 304 coupled to each unique pair of column and row lines.

Unlike memory circuit 200 shown in FIG. 2, memory circuit 300 uses a single sense amplifier 310 associated with each column line 308 which, in temporal sequence, discriminates between three pairs of stored charge levels in the selected MLC memory cell. Each of the sense amplifiers 310 is operative to generate a digital output signal indicative of the stored charge level in the MLC memory cell corresponding thereto. A column decoder 312 in memory circuit 300 is operative to receive each of the digital output signals from the respective sense amplifiers 310 and to select one of the digital output signals as a digital output, Vout, of the memory circuit as a function of a control signal, which may be a column address signal.

In order to detect the stored charge levels in the MLC memory cells 304, the sense amplifiers 310 employed in memory circuit 300 are sequential sense amplifiers. Specifically, the sense amplifiers 310 are configured to perform sequential discriminations of the different charge levels stored within the MLC memory cells 304 as a function of respective control signals supplied to the sense amplifiers. Digital logic circuitry 314 included in memory circuit 300 is preferably operative to generate the control signal(s) for controlling the temporal sequencing of the sense amplifiers 310. In the case of a two-bit MLC memory cell, at least three iterations of charge sensing are required. This technique generally results in smaller area compared to the multiple sense amplifier approach shown in FIG. 2. However, because the sensing methodology is iterative by nature, it takes significantly longer time for charge level detection and is therefore undesirable, for instance, in high-speed memory applications.

Practical limitations associated with reading and fabricating MLC memory cells have, thus far, essentially prevented the commercial feasibility of memory circuits employing MLC memory cells capable of storing more than two bits of data. With more advanced error correction techniques and advancements in flash memory technology, the storing of more bits in MLC memory cells is likely. Sense amplifiers using the above techniques will require proportionately larger area (e.g., as in the case of memory circuit 200 shown in FIG. 2), making it difficult to physically fit within the array column pitch, and/or will require proportionately longer amounts of time for level detection (e.g., as in the case of memory circuit 300 shown in FIG. 3), resulting in slower read data rates.

Figure 4:
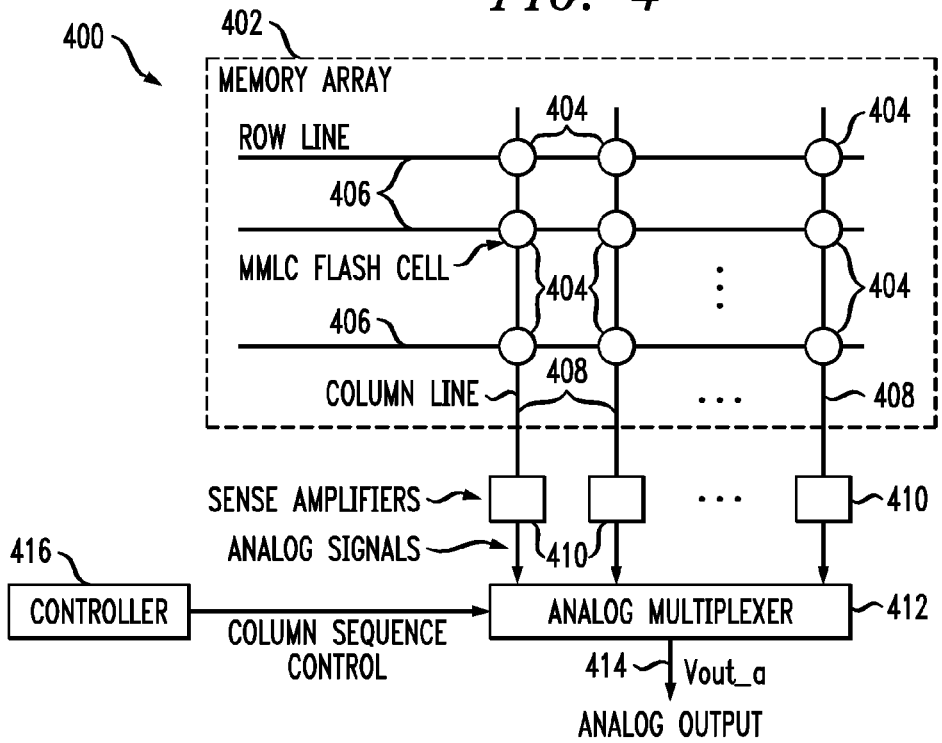
FIG. 4 is a block diagram depicting at least a portion of an exemplary memory circuit employing MLC flash memory cells, in accordance with an embodiment of the present invention.

FIG. 4 is a block diagram depicting at least a portion of an exemplary memory circuit 400, formed in accordance with an embodiment of the present invention. Memory circuit 400 comprises a memory array 402 including a plurality of memory cells 404 and a plurality of row lines 406 and column lines 408 coupled to the memory cells for selectively accessing the cells. Each memory cell 404 is preferably capable of storing many bits of information and thus is referred to herein as a many-multiple-level-cell (MMLC) memory cell. Preferably, there is a memory cell 404 coupled to each unique pair of column and row lines. Although the row lines 406 are shown as being oriented in a substantially horizontal direction and the column lines 408 being oriented in a substantially vertical direction, it is to be understood that the row lines and column lines are not limited to any particular orientation. Moreover, although the row lines 406 are depicted as being substantially orthogonal to the column lines 408, the invention is not limited to such an arrangement.

Memory circuit 400 further includes a plurality of sense amplifiers 410, each sense amplifier connected to a corresponding one of the column lines 408. Each sense amplifier 410 is operative (e.g., during a read operation) to detect an electric charge stored in a selected one of the memory cells 404 coupled to a corresponding column line 408 and to generate an analog signal indicative of the stored electric charge. In this manner, the sense amplifier essentially converts the electric charge read from the selected memory cell to a proportionate analog signal representative of the stored charge therein. One or more sense amplifiers 410 may comprise an analog buffer circuit (not explicitly shown) operative to generate an output signal having a magnitude that is substantially the same as an input signal supplied to the buffer circuit, but having a higher current. In other embodiments, the analog buffer circuit, if used, may be configured to generate an output signal that is scaled (e.g., higher or lower) in magnitude compared to the input signal supplied thereto. In either case, the respective output signals generated by the sense amplifiers 410, being analog in nature, are not confined to discrete digital (e.g., binary) output levels, such as, for example, VDD (e.g., 1.0 volt) and VSS (e.g., 0 volt) indicative of a logic "1" (logic high) and a logic "0" (logic low), respectively.

The respective analog signals generated by the sense amplifiers 410 are supplied to an analog multiplexer 412, or alternative analog switching arrangement. Analog multiplexer 412 is preferably operative to receive the respective analog signals generated by the sense amplifiers 410 and to generate an analog output signal, Vout_a, having a magnitude which varies in time as a function of the respective analog signals from the plurality of sense amplifiers. Output signal Vout_a, which is an analog output 414 of memory circuit 400, preferably comprises a continuous analog signal which is representative of sequential reads from respective memory cells 404 in the memory array 402. More particularly, the respective analog signals from the sense amplifiers 410 are fed to the analog multiplexer 412. Analog multiplexer 412, in some prescribed order, sequentially combines the respective analog signals from the sense amplifiers 410 as a function of one or more control signals, which may be a column sequence control signal, and forwards the combined analog signal to the analog output 414 of the memory circuit 400. The column sequence control signal may be generated by a controller 416 included in the memory circuit 400. Alternatively, the column sequence control signal may be generated externally and supplied to the memory circuit 400.

In accordance with one embodiment of the invention, the analog multiplexer 412 preferably comprises a plurality of transmission gates (not explicitly shown), each transmission gate having a first input connected to a corresponding one of the sense amplifiers 410, a second input for receiving a control signal (e.g., column sequence control signal), and an output. Respective outputs of the transmission gates are connected together and form an output of the analog multiplexer 412. Each transmission gate is operative to electrically couple the first input of the transmission gate to the output of the transmission gate as a function of the control signal supplied to the second input of the transmission gate. A transmission gate may include, for example, an N-channel metal-oxide-semiconductor (NMOS) transistor device and a P-channel metal-oxide-semiconductor (PMOS) transistor device connected together in parallel, with a control signal applied to a gate of the NMOS device being a logical complement of a control signal applied to a gate of the PMOS device. In this manner, both the NMOS and PMOS devices will be either turned on or turned off. Only one transmission gate in the analog multiplexer 412 will be active (e.g., turned on) at any given time as successive reads are performed on the selected memory cells. It is to be appreciated that alternative circuit configurations are contemplated for implementing the functionality of the analog multiplexer 412.

Although not explicitly shown, a buffer circuit may be optionally connected in series between the respective outputs of the transmission gates and the analog output 414 of the memory circuit 400. The buffer circuit may be integrated with the analog multiplexer 412 or it may be a separate circuit block external to the analog multiplexer. The buffer circuit may serve to beneficially protect the analog output Vout_a of the memory circuit 400 from the undesirable effects of loading caused, for example, by external circuitry connected to the memory circuit.

Figure 5:
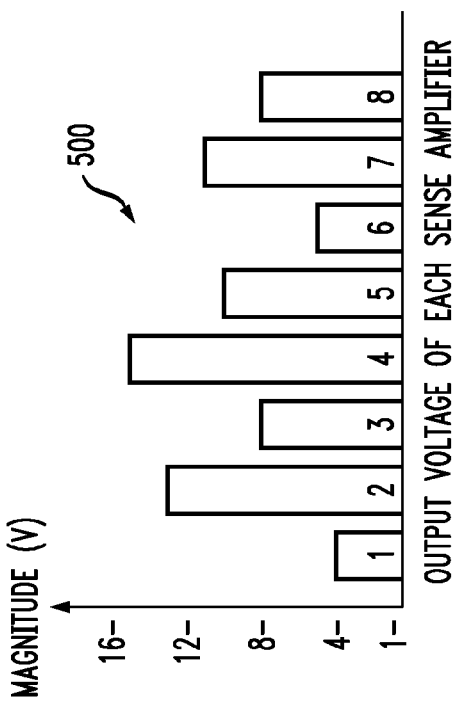
FIG. 5 depicts exemplary analog signals generated by eight sense amplifiers and at least a portion of a corresponding continuous waveform showing a first method in which the respective analog signals may be combined to form the analog output signal generated by the memory circuit shown in FIG. 4, in accordance with an aspect of the invention.

By way of illustration only, FIG. 5 depicts exemplary analog signals 500 generated by eight sense amplifiers, numbered 1 through 8, and at least a portion of a corresponding continuous waveform 502 showing a first method in which the respective analog signals may be combined to form the analog output signal Vout_a 504 generated by memory circuit 400 (FIG. 4), in accordance with an aspect of the invention. While analog signals from eight sense amplifiers are shown, the invention is not limited to any particular number of sense amplifiers. Analog signals 500 are shown as relative voltage (V) magnitudes and may not represent absolute voltages. The relative voltage magnitude of the analog output signal Vout_a 504 is shown as a function of time. In this illustrative case, the analog signals from each of the eight sense amplifiers are combined in a simple ascending and/or descending numerical sequence to generate the analog output signal Vout_a 504. It is to be understood, however, that the respective signals from the sense amplifiers can be sequentially combined in any order, with or without skipping sense amplifier outputs.

Figure 6:
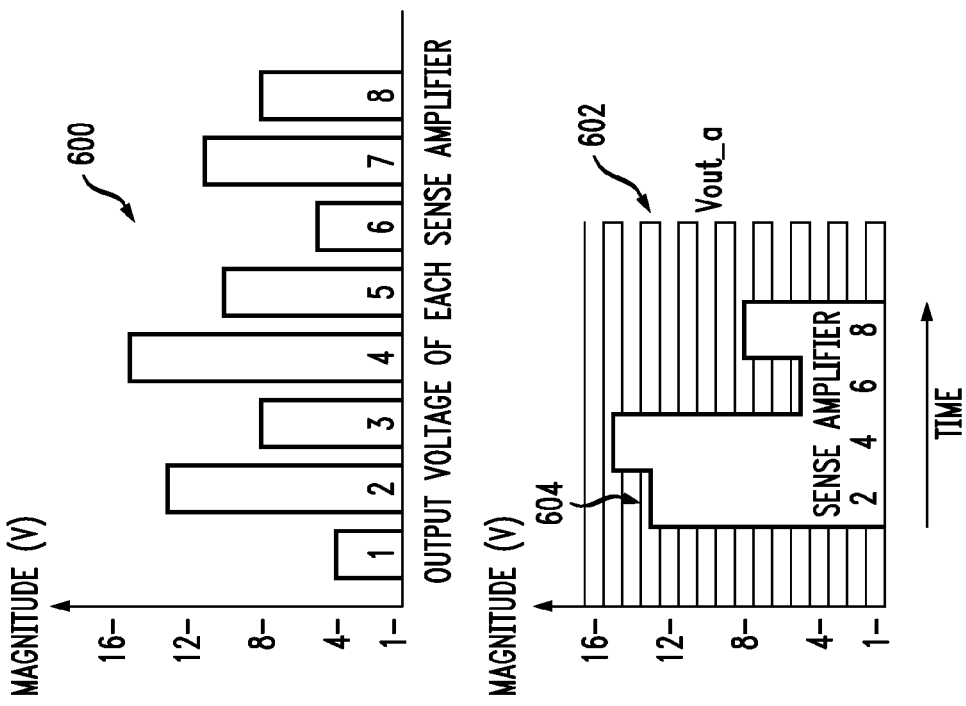
FIG. 6 depicts exemplary analog signals generated by eight sense amplifiers and at least a portion of a corresponding continuous waveform showing a second method in which the respective analog signals may be combined to form the analog output signal generated by the memory circuit shown in FIG. 4, in accordance with another aspect of the invention.

For example, FIG. 6 depicts exemplary analog signals 600 from eight sense amplifiers, numbered 1 through 8, and at least a portion of a corresponding continuous waveform 602 showing a second method in which the respective analog signals may be combined to form the analog output signal Vout_a 604 generated by memory circuit 400 (FIG. 4), in accordance with another aspect of the invention. As apparent from the figure, even sense amplifiers, sense amplifiers 2, 4, 6 and 8, may be combined in one sequence and the outputs of all odd sense amplifiers in another sequence (not shown). Typically, all outputs will be in one sequence or another.

Regardless of the manner in which the respective analog signals generated by the sense amplifiers are combined to form the analog output signal Vout_a, the analog output signal preferably comprises a sequence of data residing along a row of cells within the memory. It may or may not contain data from all cells along the same row; the analog output signal Vout_a may contain data from multiple rows of memory cells.

Optionally, error correction can be applied to the analog output signal Vout_a. Error correction circuitry (not explicitly shown) may be connected to the analog multiplexer 412 in memory circuit 400 shown in FIG. 4 operative to correct one or more bit errors detected in the analog output signal. For example, error correction techniques known to hard drive read channel designers may be similarly applied to the analog output signal, although the invention is not limited to such error correction techniques. In the context of rotating hard disk drives, continuous blocks of data, often referred to as "sectors," are typically 512, 1024 or 2048 bytes in length. It may be desirable, for error correction purposes, to have the sequence of memory cells represented in the combined analog output signal Vout_a reflect cells that are not physically adjacent. Given the number of memory cells connected to a given row line, the spacing between cells making up the analog output signal and the desired sector length, the number of rows represented in the analog output signal sequence can be determined.

At least a portion of the circuits and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in any application and/or electronic system which utilizes memory, embedded or otherwise. Suitable systems for implementing techniques of the invention may include, but are not limited to, personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit, comprising:
   a plurality of memory cells, each of the memory cells being operative to store multiple bits of data therein;
   a plurality of column lines and row lines coupled to the memory cells for selectively accessing the memory cells;
   a plurality of sense amplifiers, each of the sense amplifiers being connected to a corresponding one of the column lines and being operative to detect an electric charge stored in a selected one of the memory cells coupled to the corresponding column line and to generate an analog signal indicative of the stored electric charge; and
   an analog multiplexer connected to the plurality of sense amplifiers, the analog multiplexer being operative to receive the respective analog signals from the plurality of sense amplifiers and to generate an analog output signal having a magnitude which varies in time as a function of the respective analog signals from the plurality of sense amplifiers.

2. The circuit of claim 1, wherein the output signal generated by the analog multiplexer comprises a continuous analog signal representative of sequential reads from at least a subset of the plurality of memory cells.

3. The circuit of claim 1, wherein the analog multiplexer is operative to convert the electric charge stored in the selected memory cell to a proportionate analog voltage representative of the stored electric charge.

4. The circuit of claim 1, wherein at least one of the plurality of sense amplifiers comprises an analog voltage buffer.

5. The circuit of claim 1, wherein the analog multiplexer comprises a plurality of transmission gates, each transmission gate having a first input connected to a corresponding one of the sense amplifiers, a second input for receiving a control signal, and an output, respective outputs of the transmission gates being connected together and forming an output of the analog multiplexer, each transmission gate being operative to electrically couple the first input of the transmission gate to the output of the transmission gate as a function of the control signal supplied to the second input of the transmission gate.

6. The circuit of claim 1, further comprising error correction circuitry connected to the analog multiplexer, the error correction circuitry being operative to correct at least one bit error detected in the analog output signal.

7. The circuit of claim 1, wherein the magnitude of the analog output signal is representative of electric charge stored in a sequence of memory cells that are not physically adjacent to one another.

8. The circuit of claim 1, further comprising a controller connected to the analog multiplexer and operative to control a sequence of the respective analog signals from the plurality of sense amplifiers represented in the analog output signal.

9. The circuit of claim 1, wherein the analog multiplexer is operative to combine the respective analog signals from the plurality of sense amplifiers in at least one of an ascending and a descending numerical sequence to generate the analog output signal.

10. An integrated circuit including at least one memory circuit, the at least one memory circuit comprising:
    a plurality of memory cells, each of the memory cells being operative to store multiple bits of data therein;
    a plurality of column lines and row lines coupled to the memory cells for selectively accessing the memory cells;
    a plurality of sense amplifiers, each of the sense amplifiers being connected to a corresponding one of the column lines and being operative to detect an electric charge stored in a selected one of the memory cells coupled to the corresponding column line and to generate an analog signal indicative of the stored electric charge; and
    an analog multiplexer connected to the plurality of sense amplifiers, the analog multiplexer being operative to receive the respective analog signals from the plurality of sense amplifiers and to generate an analog output signal having a magnitude which varies in time as a function of the respective analog signals from the plurality of sense amplifiers.

11. The integrated circuit of claim 10, wherein the output signal generated by the analog multiplexer comprises a continuous analog signal representative of sequential reads from at least a subset of the plurality of memory cells.

12. The integrated circuit of claim 10, wherein the analog multiplexer is operative to convert the electric charge stored in the selected memory cell to a proportionate analog voltage representative of the stored electric charge.

13. The integrated circuit of claim 10, wherein at least one of the plurality of sense amplifiers comprises an analog voltage buffer.

14. The integrated circuit of claim 10, wherein the analog multiplexer comprises a plurality of transmission gates, each transmission gate having a first input connected to a corresponding one of the sense amplifiers, a second input for receiving a control signal, and an output, respective outputs of the transmission gates being connected together and forming an output of the analog multiplexer, each transmission gate being operative to electrically couple the first input of the transmission gate to the output of the transmission gate as a function of the control signal supplied to the second input of the transmission gate.

15. The integrated circuit of claim 10, wherein the at least one memory circuit further comprises error correction circuitry connected to the analog multiplexer, the error correction circuitry being operative to correct at least one bit error detected in the analog output signal.

16. The integrated circuit of claim 10, wherein the magnitude of the analog output signal is representative of electric charge stored in a sequence of memory cells in the at least one memory circuit that are not physically adjacent to one another.

17. The integrated circuit of claim 10, wherein the at least one memory circuit further comprises a controller connected to the analog multiplexer and operative to control a sequence of the respective analog signals from the plurality of sense amplifiers represented in the analog output signal.

18. The integrated circuit of claim 10, wherein the analog multiplexer is operative to combine the respective analog signals from the plurality of sense amplifiers in at least one of an ascending and a descending numerical sequence to generate the analog output signal.

19. A method of reading a memory circuit including a plurality of memory cells, each of the memory cells being operative to store multiple bits of data therein, the method comprising the steps of:
    for each of at least a subset of the memory cells, converting an electric charge stored in at least a selected one of the memory cells to a proportionate analog signal representative of the stored electric charge, the electric charge stored in the selected memory cell being indicative of a state of the selected memory cell;
    combining a plurality of analog signals from a plurality of corresponding memory cells in the memory circuit to generate an analog output signal, the analog output signal having a magnitude which varies in time as a function of the respective analog signals from the plurality of corresponding memory cells; and
    sampling the analog output signal at distinct times representative of a sequence of the respective analog signals from the plurality of corresponding memory cells.

20. An electronic system, comprising:
    at least one integrated circuit including at least one embedded memory circuit, the at least one embedded memory circuit comprising:
        a plurality of memory cells, each of the memory cells being operative to store multiple bits of data therein;
        a plurality of column lines and row lines coupled to the memory cells for selectively accessing the memory cells;
        a plurality of sense amplifiers, each of the sense amplifiers being connected to a corresponding one of the column lines and being operative to detect an electric charge stored in a selected one of the memory cells coupled to the corresponding column line and to generate an analog signal indicative of the stored electric charge; and
        an analog multiplexer connected to the plurality of sense amplifiers, the analog multiplexer being operative to receive the respective analog signals from the plurality of sense amplifiers and to generate an analog output signal having a magnitude which varies in time as a function of the respective analog signals from the plurality of sense amplifiers.

* * * * *